United States Patent
Nuutinen

(10) Patent No.: US 9,154,125 B2
(45) Date of Patent: Oct. 6, 2015

(54) METHOD OF CONTROLLING AN IGBT AND A GATE DRIVER

(75) Inventor: Leo Nuutinen, Helsinki (FI)

(73) Assignee: ABB TECHNOLOGY OY, Helsinki (FI)

( * ) Notice: Subject to any disclaimer, the term of this patent is extended or adjusted under 35 U.S.C. 154(b) by 0 days.

(21) Appl. No.: 12/699,369

(22) Filed: Feb. 3, 2010

(65) Prior Publication Data

US 2010/0194451 A1 Aug. 5, 2010

(30) Foreign Application Priority Data

Feb. 5, 2009 (EP) .................................... 09152138

(51) Int. Cl.
- *H03K 3/00* (2006.01)
- *H03K 17/16* (2006.01)
- *H03K 17/082* (2006.01)

(52) U.S. Cl.
CPC .......... *H03K 17/166* (2013.01); *H03K 17/0828* (2013.01); *H03K 17/168* (2013.01)

(58) Field of Classification Search
CPC H03K 17/166; H03K 17/0828; H03K 17/168
USPC ...................... 327/108–112; 326/87
See application file for complete search history.

(56) References Cited

U.S. PATENT DOCUMENTS

| | | | |
|---|---|---|---|
| 3,872,327 A * | 3/1975 | Rudert et al. ................. 327/579 |
| 5,467,242 A * | 11/1995 | Kiraly ............................. 361/94 |
| 5,532,635 A * | 7/1996 | Watrous et al. ............... 327/310 |
| 5,608,595 A | 3/1997 | Gourab et al. |
| 5,739,707 A * | 4/1998 | Barraclough .................. 327/112 |
| 5,864,584 A * | 1/1999 | Cao et al. ........................ 375/244 |
| 6,335,608 B1 | 1/2002 | Takahashi |
| 6,563,352 B1 * | 5/2003 | Gohel et al. ................... 327/108 |
| 6,624,662 B1 * | 9/2003 | Volk ................................ 326/87 |
| 6,788,102 B2 * | 9/2004 | Atyunin et al. ................. 326/30 |
| 6,853,149 B2 * | 2/2005 | Roh et al. .................... 315/169.4 |
| 7,031,124 B2 * | 4/2006 | Takahashi ........................ 361/30 |
| 7,046,051 B2 * | 5/2006 | Melbert et al. ................. 327/110 |
| 7,276,954 B2 * | 10/2007 | Otoshi et al. ................... 327/423 |
| 7,368,972 B2 * | 5/2008 | Grbovic ........................ 327/434 |
| 7,463,073 B2 * | 12/2008 | Chung et al. ................... 327/112 |
| 7,501,851 B2 * | 3/2009 | Venditti et al. .................. 326/30 |
| 2004/0120090 A1 | 6/2004 | Galli et al. |

FOREIGN PATENT DOCUMENTS

| | | |
|---|---|---|
| DE | 102007036728 | 9/2008 |
| EP | 0 614 278 A1 | 9/1994 |

(Continued)

OTHER PUBLICATIONS

European Search Report dated Jun. 24, 2009.

(Continued)

*Primary Examiner* — Kenneth B Wells

(74) *Attorney, Agent, or Firm* — Buchanan Ingersoll & Rooney PC

(57) ABSTRACT

A method is disclosed for controlling an IGBT component and a gate driver. An exemplary method includes producing, with two separate driver circuits, a gate voltage for controlling the IGBT component, the outputs of the driver circuits being connected to free ends of a series connection of resistive components. A location, such as a midpoint between the series connection, forms the gate voltage.

12 Claims, 4 Drawing Sheets

(56) References Cited

FOREIGN PATENT DOCUMENTS

| | | |
|---|---|---|
| EP | 0 680 147 A2 | 11/1995 |
| WO | WO 2008/029248 | 3/2008 |

OTHER PUBLICATIONS

Office Action issued in a corresponding EPO application dated Jun. 27, 2011, 5 pps.

* cited by examiner

METHOD OF CONTROLLING AN IGBT AND A GATE DRIVER

RELATED APPLICATION

This application claims priority under 35 U.S.C. §119 to European Patent Application No. 09152138.5 filed in Europe on Feb. 5, 2009, the entire content of which is hereby incorporated by reference in its entirety.

FIELD

The present disclosure relates to gate drivers, such as gate drivers for insulated-gate bipolar transistors (IGBT).

BACKGROUND INFORMATION

IGBTs are power semiconductor components which are used, for example, as switches in high power applications. An IGBT is a gate controlled component, which can be turned on and off from its gate.

The properties of IGBTs can make them very attractive to be used in high-power applications, since IGBT switches are able to switch high currents at high voltage levels. Further, IGBT switches are fast in operation, with tolerable turn-on and turn-off losses. This is due to the fact that simultaneous time of the voltage over the component and current through the component is short.

IGBTs can include a gate drive circuit which is able to quickly charge the internal capacitances of the component for turning on the component. Similarly, the drive circuit can remove the charge from the gate for cutting the current from the component. The gate drivers are connected to the gate and emitter terminals of the components, and a purpose of the driver is to control the potential of the gate with respect to the emitter. When an IGBT is turned on, the gate is made positive with respect to the emitter, and when a turn-off is desired, the potential of the gate is made negative with respect to the emitter.

For this purpose, gate driver circuits include a two-sided auxiliary voltage, from which positive and negative gate voltages with respect to an emitter can be derived. This two-sided voltage can be generated from a voltage divided with a series connection of capacitors such that a midpoint of the capacitors can be connected to the emitter of the controlled component. Either a positive or negative voltage with respect to the emitter can then be controlled at the gate.

Gate driver circuits can also shut down the controlled IGBT in the event of excessive current flowing through the component. Over current situations, which can be generated by short circuits, should be removed from the circuit by shutting down the component in question. The IGBT which is conducting an over current cannot be turned off in a normal manner, since the quick removal of excessive current would cause voltage spikes across the collector and emitter of the component. This voltage spike could destroy the component and the devices connected to the component.

Known gate driver circuits which are also operable to remove short circuit current using soft shutdown can be complicated structures having many different components and therefore involving a large surface area. An example of a gate driver circuit is presented in U.S. Pat. No. 6,335,608.

SUMMARY

A method of controlling an IGBT component is disclosed, comprising: producing a gate voltage for controlling an IGBT component by connecting outputs of two separate driven circuits to free ends of a series connection of resistive components; and forming the gate voltage at a point between the series connection.

A gate driver circuit is disclosed for producing a gate voltage for controlling an IGBT component, the gate driver circuit comprising: two separate driver circuits; and a series connection of resistive components with outputs of the driver circuits connected to free ends of the series connection of resistive components such that a location between the series connection forms a gate voltage output.

BRIEF DESCRIPTION OF THE DRAWINGS

In the following, other objects and advantages will be described in greater detail by reference to exemplary embodiments, and the accompanying drawings, in which.

DETAILED DESCRIPTION

A method and gate driven circuit are disclosed which include two control inputs for controlling an IGBT component. Resistive components can be connected to the output of these control inputs and, depending on the state of the control inputs, the resistive components form a voltage divider and set the gate of the controlled IGBT to a potential between the auxiliary voltages. This potential can be generated from the auxiliary voltage with the resistive voltage divider and is suitable for getting the IGBT softly from the over current state.

An exemplary embodiment can provide a soft shutdown feature with a minimum amount of extra components and this feature can be seamlessly integrated with normal turn-on and turn-off features in a gate driver. Exemplary embodiments, can be implemented with a simple design by using well-tested, known components. When the number of components is small, the space for the components is also small, thereby taking considerably less room in a housing of electrical equipment having the controlled IGBT switches.

Figure 1:
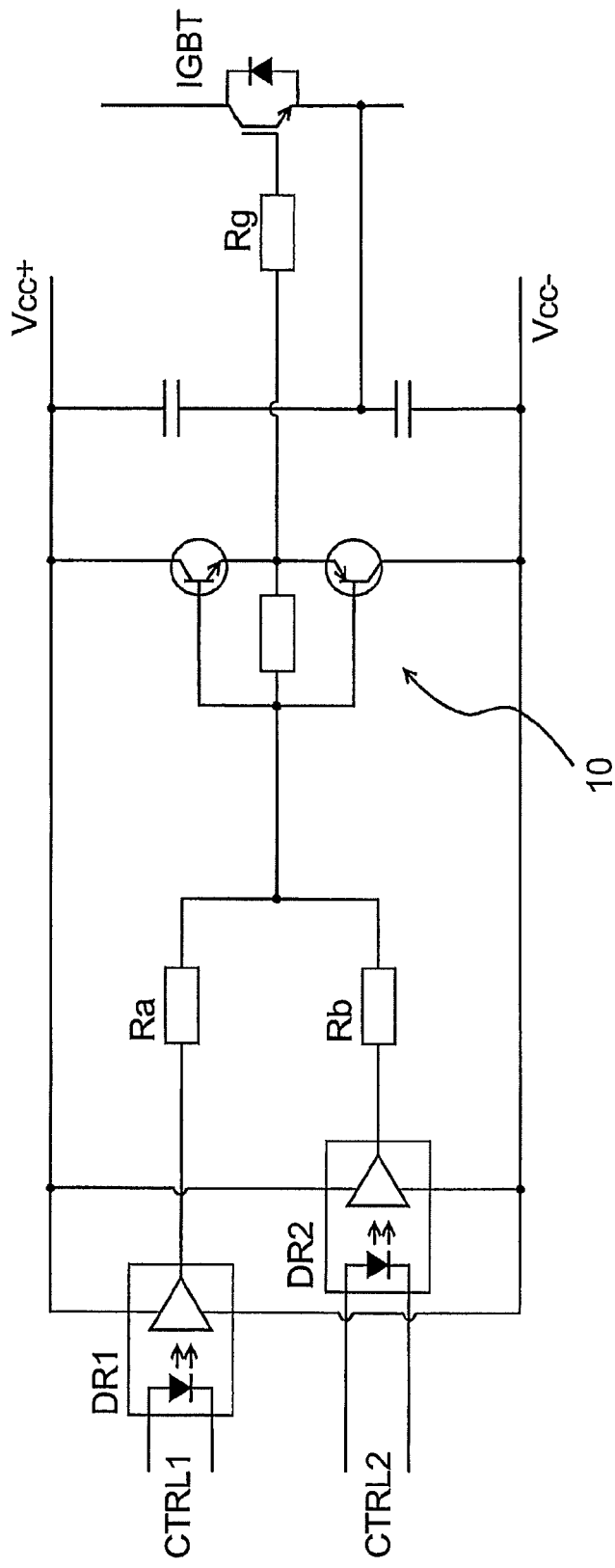
FIGS. 1, 2, 3 and 4 show different exemplary embodiments of the gate driver of the present disclosure.

FIG. 1 shows an exemplary embodiment of the present disclosure, wherein control of the IGBT is carried out with two separate control signals CTRL1 and CTRL2. The control signals control separate driver circuits DR1 and DR2, which are, for example, optocouplers of the push-pull type. An auxiliary voltage, which has a positive and a negative bus VCC+, VCC− is connected to supply voltage to the driver circuits. The driver circuits are controlled according to the control signal so that the output of the driver circuits is either at the potential of the positive bus or at the potential of the negative bus of the auxiliary voltage (e.g., high or low). The driver circuits DR1, DR2 are, for example, optocouplers which are fast components and driven by current. Thus, a current in the driver circuit represents an ON-state, and when the driver circuit is without current it represents OFF-state.

In an exemplary circuit of the disclosure, one terminal of a resistive component Ra is connected to the output of one of the driver circuits DR1 and one terminal of a resistive component Rb is connected to the output of the other driver circuit DR2. The other terminals of the resistive components are further connected together. The resistive components are thus connected in series between the outputs of the driver circuits.

The connection node between the resistive components Ra, Rb, which provides a gate voltage, can be further connected to an output stage 10 which serves to drive the controlled IGBT switch. The output stage 10 in FIG. 1 includes (e.g., consists of) two transistors and a resistor for providing a voltage to the gates of the transistor which is higher than the emitter voltage. However, the resistor is not necessary for the functioning of the output stage. When in place, the resistor in the output stage is connected between the gate and emitter of both transistors. Further, the collector of one of the transistors is connected to positive bus VCC+ and the collector of the other transistor is connected to negative bus VCC−. An exemplary purpose of the output stage 10 is to output the same voltage as in its input to the gate of the controlled IGBT. The output stage can provide high currents and therefore can be suitable for controlling the IGBT switch.

Further, in FIG. 1 a series connection of capacitors is shown between the positive bus and negative bus of the auxiliary voltage. The midpoint between the capacitors is connected to the emitter of the controlled IGBT such that the gate driver can control the gate either to negative or positive potential with respect to the emitter.

FIG. 1 also shows a gate resistor Rg, which can be used for slowing down the rate of voltage change when the IGBT is controlled.

According to an exemplary method of the disclosure, two separate driver circuits are controlled for producing a gate voltage for the control of an IGBT switch, the gate voltage having three different values depending on the control of the driver circuits.

In FIG. 1, when both driver circuits DR1, DR2 are controlled so that their outputs are at the positive potential VCC+, also the gate voltage produced in the common node of the resistive components Ra, Rb is at the high potential, (e.g., a positive potential VCC+). Thus, the produced gate voltage is fed to the output stage, the output of which follows the gate voltage and produces current to turn the IGBT on or to keep it in a conductive state.

When both driver circuits DR1, DR2 are controlled off, their output corresponds to the low potential (e.g., a negative potential VCC−). The gate voltage also assumes the same potential, and output stage 10 controls the IGBT with the same voltage and thereby turns it off or keeps it in the blocking state.

In case the IGBT switch is turned on, and an excessive current is flowing through the switch, the switch can be brought softly to a non-conducting state. According to an exemplary method of the disclosure, the two driver circuits are controlled to provide a gate voltage having a lowered value by establishing a resistive voltage divider. The gate voltage is produced at a point, or location (e.g., the midpoint) between the resistive components Ra, Rb, which form the resistive voltage divider and divides the auxiliary voltage according to a ratio of the resistances. If the voltage between the negative potential VCC− and positive potential VCC+ is denoted as VCC and the resistances of the resistive components are denoted as Ra and Rb, the gate voltage will be VCC*Ra/(Ra+Rb) if the resistive component Ra is the upper component (e.g., switched to the positive potential VCC+).

The ratio of the resistances can thus define the gate voltage during soft turn-off. The gate voltage can be selected to be positive (e.g. above the voltage fed to the emitter of the IGBT) so that the IGBT will still remain in the conducting state. Although the gate voltage is positive, it is still considerably lower than the normal turn-on voltage. This will impair the current conducting capability of the component and thus the current gets smaller. The gate voltage is kept at this lowered level for some time, after which the normal turn-off gate voltage is used for controlling the component to a blocking state.

An exemplary gate driver according to the present disclosure also enables polarization of the turn-on and turn-off procedures. It is known to use gate resistors with different resistances for turn-on and turn-off. These resistors are connected to the gate via diodes which select the resistor depending on the direction of the current.

When, for example, turn-on is carried out by delaying the control of the other driver circuit, the gate voltage first rises to a level defined by the resistive voltage division. After the delay, both of the driver circuits are controlled to a high state. This way the gate voltage can be made to rise in steps.

Similarly, the turn-off process can be carried out in steps. An exemplary purpose of this polarization of the switching process is to affect the rate of voltage change and the current tailing of the diodes in the main circuit. The high rate of voltage change is known to cause problems relating to EMC and when the tailing current is cut, it can cause high voltage spikes. Both of these effects may be eliminated by controlling the rate of voltage change by raising the gate voltage stepwise.

Figure 2:
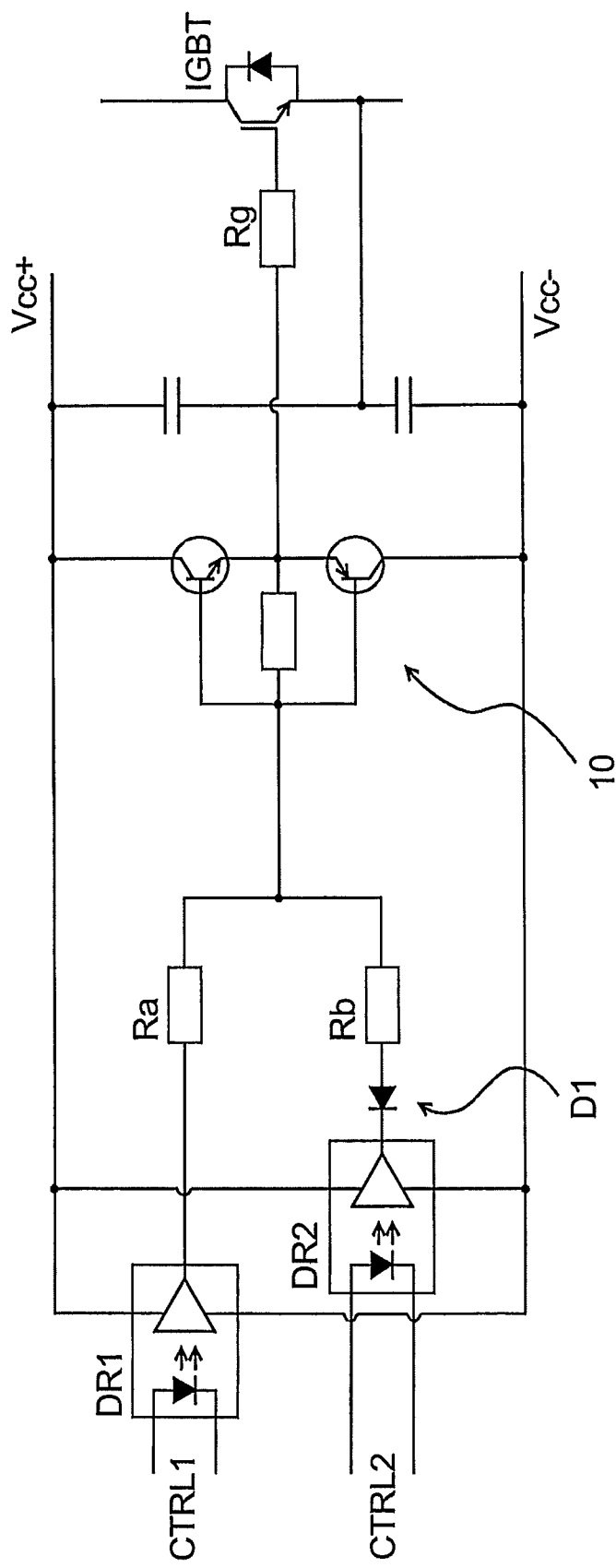

FIG. 2 shows another exemplary embodiment of the disclosure, in which one of the resistors is connected to the output of the driver circuit via a diode D1. Otherwise the structure of FIG. 2 corresponds to FIG. 1. The diode connected in series with the resistors affects the circuit such that the normal turn-on and turn-off are carried out with only one of the driver circuits, while the other is controlled to high potential. In the circuit of FIG. 2 the normal turn-on and turn-off procedures are carried out with driver circuit DR1, while the output of driver circuit DR2 is controlled to potential VCC+. The diode D1 is connected to the output of driver circuit DR2 such that the cathode of the diode is connected to the output. When the output of driver circuit DR2 is connected to high potential, the diode blocks the voltage from the high potential, and thus the gate voltage is defined purely by the output of driver circuit DR1.

When the output of driver circuit DR2 is controlled to a low potential and the driver circuit DR1 to a high potential, a resistive voltage divider is formed, and the gate voltage is formed as in connection with FIG. 1. The embodiment of FIG. 2 can somewhat simplify the control, since in normal operation only one driver circuit receives active control. When an over current situation occurs, the control mode is changed and also the driver circuit DR2 receives active control.

Figure 3:
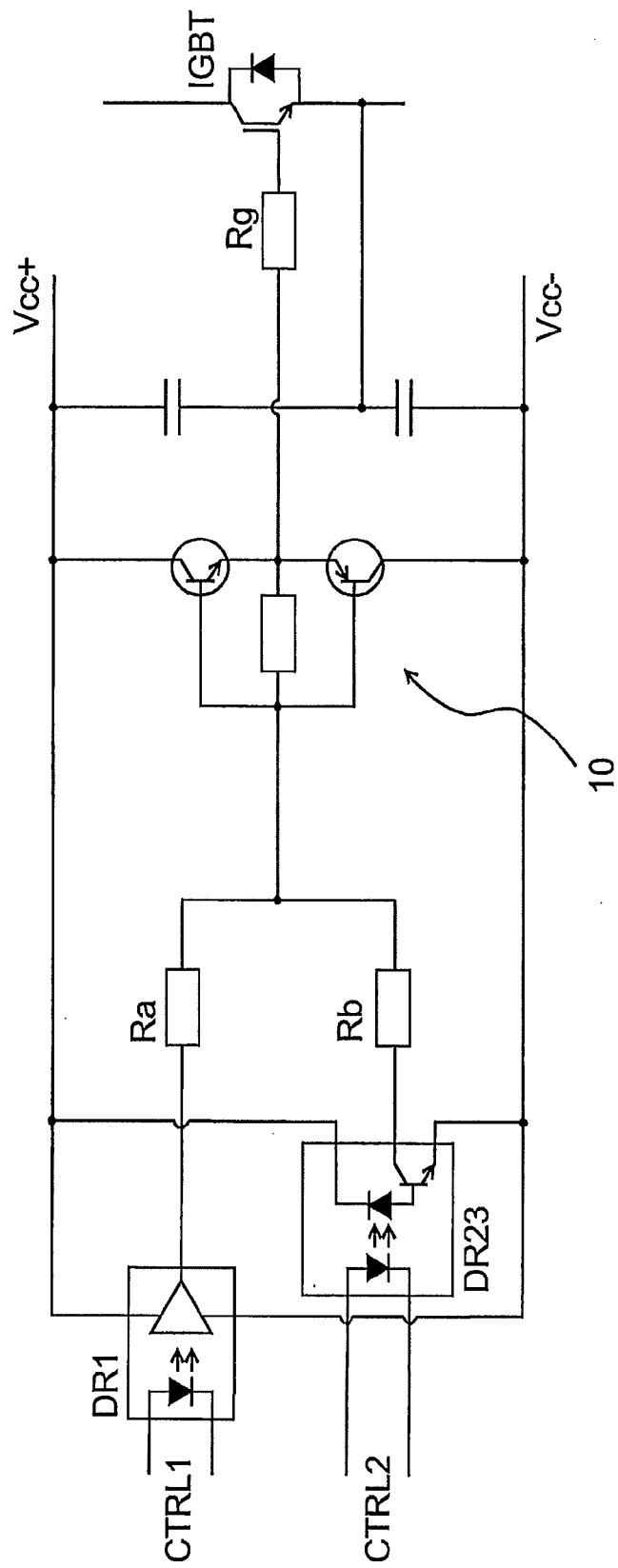

FIG. 3 shows another exemplary embodiment of the present disclosure. This embodiment differs from the embodiment of FIG. 1 in that one driver circuit DR23 is implemented as an open-collector-type optocoupler. When a control signal is applied to the input of driver circuit DR23 in FIG. 3, the transistor inside the circuit conducts and draws the collector to potential of the emitter (e.g., to VCC−). When no control is applied to circuit DR23, the internal transistor does not conduct, and the other driver circuit DR1 controls the value of the gate voltage seen between the series connection of the resistors Ra, Rb.

Thus, the control of the IGBT can be carried out by controlling driver circuit DR1 and keeping driver circuit DR23 without control. When over current is detected, driver circuit DR23 is controlled active thereby forcing its output to low value. When at the same time the driver circuit DR1 is also controlled active, the resistances are connected across the auxiliary voltage. This sets the gate voltage to a desired value for initiating the soft turn-off of the controlled IGBT. Once the gate voltage has been in this level for a few microseconds, the driver circuits are controlled to a low state to produce a negative gate voltage for turning the IGBT completely off.

Figure 4:
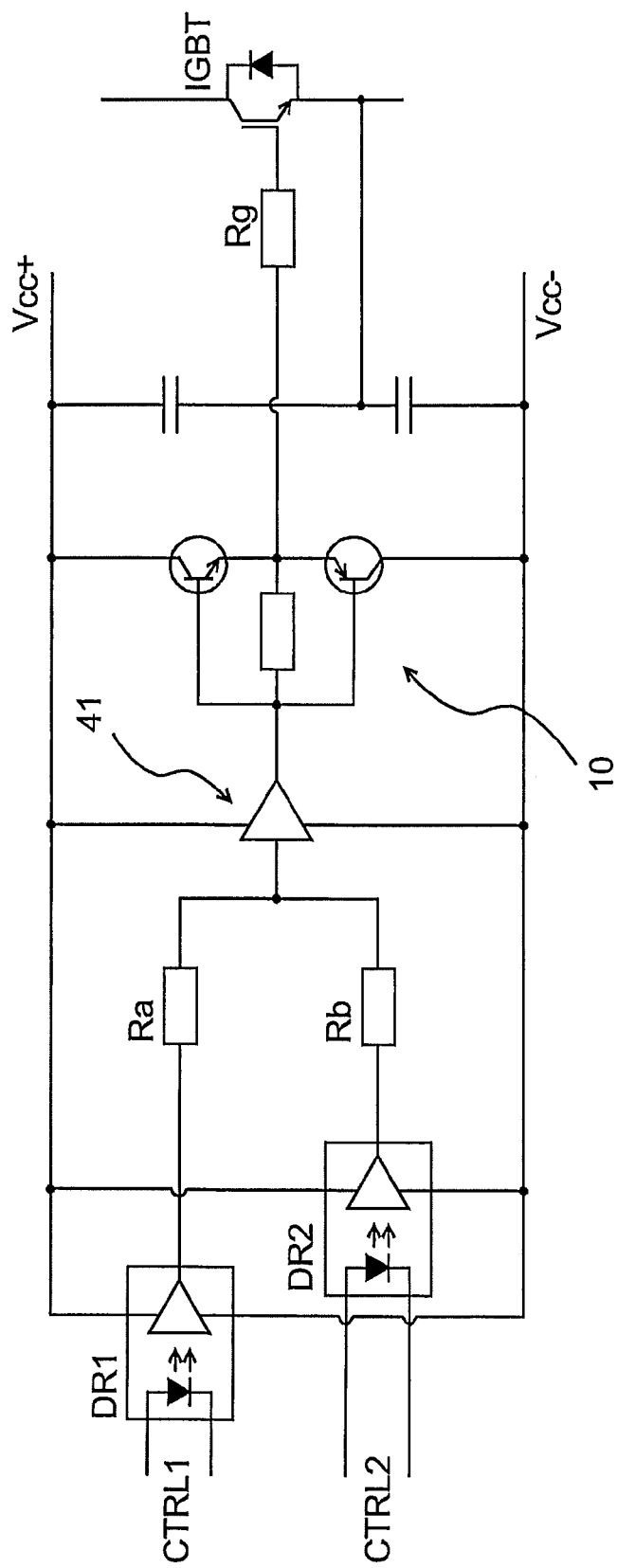

FIG. 4 shows yet another exemplary embodiment of the present disclosure. The circuit structure of this embodiment differs from the embodiment of FIG. 1 in that the circuit includes a rail-to-rail buffer or operational amplifier 41. The input of this buffer circuit 41 is connected to the node between the series connection of resistive components (e.g., to gate voltage). The buffer circuit receives its operation voltage from the auxiliary voltages VCC+, VCC−, and outputs a voltage corresponding to gate voltage to the input node of the output stage.

Due to the rail-to-rail buffer or operational amplifier 41, the resistances of the resistive components Ra, Rb can be selected to have higher values and the driver circuits DR1, DR2 can be selected to have lower current ratings than in circuits where the driver circuits directly control the output stage. When buffer circuit 41 is in use, it serves to feed current to drive the output stage. The use of buffer circuit 41 can enable use of less expensive driver circuits DR1, DR2 and can help to minimize losses in the gate driver.

It is clear for a skilled person that various parts of the gate driver circuit can be implemented with different components. This applies to each part of the gate driver circuit, including the input stage (e.g., production of control signals for the driver circuits, driver stage and output stage). It will be also apparent to a person skilled in the art that, as the technology advances, features disclosed herein can be implemented in various ways. The disclosure and its embodiments are not limited to the examples described above but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of controlling an IGBT component, comprising:
   connecting first and second resistive components in series;
   connecting an output of a first driver circuit to a free end of the first resistive component;
   connecting an output of a second driver circuit to a free end of the second resistive component;
   connecting the first driver circuit and the second driver circuit to each of a shared positive and a negative supply voltage, wherein the first and second driver circuits are connected in parallel between the positive and negative supply voltages;
   independently and simultaneously controlling the first driver circuit and the second driver circuit outputs to one of a high potential or a low potential to produce a voltage at a point between the series connection of the first and second resistive components; and
   controlling a gate voltage of an IGBT component via the voltage at the point between the series connection of the first and second resistive components.

2. The method according to claim 1, comprising:
   controlling the output of one of the first and second driver circuits to the high potential and the output of a second of the driver circuits to the low potential, when the IGBT component carries an over current, to set the point between the series connection of resistive components to a potential between the high and low potentials for initiating turn-off of the IGBT component.

3. The method according to claim 2 comprising:
   controlling the point between the series connection of the first and second resistive components to a low potential after the turn-off of the IGBT has been initiated and the gate voltage has been controlled to a potential between the high and low potentials.

4. The method according to claim 1, comprising:
   controlling the point between the series connection of resistive components to a high potential when turn-on of the IGBT is desired.

5. The method according to claim 1, comprising:
   controlling the point between the series connection of resistive components to a low potential when turn-off of the IGBT is desired.

6. A gate driver circuit for producing a gate voltage for controlling an IGBT component, the gate driver circuit comprising:
   first and second resistive components connected in series;
   a first driver circuit connected to a positive and a negative voltage supply and having an output connected to a free end of the first resistive component; and
   a second driver circuit connected to the positive and the negative voltage supply having an output connected to a free end of the second resistive component;
   an IGBT connected at point between the series connection of the first and second resistive components,
   wherein the first and second driver circuits are connected in parallel between the positive and negative supply voltages, and
   wherein a gate voltage for controlling the IGBT is formed at a point between the series connection of the first and second resistive components based on a respective high or low potential to which the outputs of the first and second driver circuits are independently and simultaneously controlled.

7. The gate driver circuit according to claim 6, wherein the series connection of resistive components forms a resistive voltage divider to set a location of the resistive components to a potential between high potential and low potential states.

8. The gate driver circuit according to claim 6, wherein the first and second driver circuits are optocouplers having outputs which are controlled to both high potential and low potential states.

9. The gate driver circuit according to claim 8, comprising:
   a diode connected between the output of one of the first and second driver circuits and the series connection of first and second resistive components such that a cathode of the diode is connected to an output of the driver circuit,
   wherein a second of the two driver circuits being configured to generate turn-on and turn-off voltages while the output of the first or second driver circuits having the diode is at the high potential state, and
   wherein a midpoint between the resistive voltage divider is set to a potential between the high and low potential states when the one driver circuit having the diode is set to the low potential state and the second driver circuit is set to the high potential state.

10. The gate driver circuit according to claim 6, wherein:
    the first driver circuit is an open-collector-type optocoupler, and the second driver circuit is a push-pull-type optocoupler for generating turn-on and turn-off voltages,
    an output of the open-collector-type optocoupler is kept at a high potential state, and
    the point is a midpoint between the resistive voltage divider which is set to a potential between the high potential state and a low potential state when an output of the open-collector-type optocoupler to the low potential state and the push-pull type optocoupler to the high potential state.

11. The gate driver circuit according to claim 6, comprising:
an output stage connected to the point between the series connection of resistive components for producing the gate voltage for driving the gate of a controlled IGBT component.

12. The gate driver circuit according to claim 11, comprising:
a buffer circuit connected between the point between the series connection of resistive components and the output stage.

* * * * *